United States Patent [19]
Palm et al.

[11] Patent Number: 5,307,149
[45] Date of Patent: Apr. 26, 1994

[54] METHOD AND APPARATUS FOR ZERO FORCE PART PLACEMENT

[75] Inventors: Steven G. Palm, Minneapolis, Minn.; Elwin M. Beaty, 13529 Arthur St., Minnetonka, Minn. 55305

[73] Assignees: Elwin M. Beaty; Elaine E. Beaty, Minnetonka, Minn.

[21] Appl. No.: 929,939

[22] Filed: Aug. 14, 1992

[51] Int. Cl.$^5$ .............................................. G01B 11/02
[52] U.S. Cl. .................................... 356/375; 356/381; 356/237; 33/549; 33/561
[58] Field of Search ............... 356/375, 394, 237, 381; 250/561, 562; 33/549, 558, 561

[56] References Cited

U.S. PATENT DOCUMENTS

| | | | |
|---|---|---|---|
| 4,821,157 | 4/1989 | Birk et al. | 356/237 |
| 5,114,229 | 5/1992 | Hideshima | 356/237 |
| 5,208,463 | 5/1993 | Honma et al. | 356/394 |

FOREIGN PATENT DOCUMENTS 15707   1/1991   Japan ................................. 356/375

Primary Examiner—F. L. Evans
Attorney, Agent, or Firm—Leone & Moffa

[57] ABSTRACT

A method for part placement of a semiconductor chip for inspection where the semiconductor chip has a plurality of leads defining a seating plane and a body having a top. The method includes the steps of placing the body on a platform in an up position where the plurality of leads are suspended and probing the top of the body. Next measuring the position of the top of the body with reference to a predetermined coordinate system is done. Then the part is moved until the part is suspended on the plurality of leads on a reference plane. The top of the body is then probed for a second time, and the second position of the top of the body is measured with reference to the predetermined coordinate system. The thickness of the part is then determined as the distance between the top of the part and its seating plane.

16 Claims, 7 Drawing Sheets

METHOD AND APPARATUS FOR ZERO FORCE PART PLACEMENT

BACKGROUND OF THE INVENTION

I. Field of the Invention

The present invention relates to the inspection of semiconductor chips and in particular to the inspection of leads on a semiconductor chip using zero force part placement.

II. Discussion of the Prior Art

Inspection of leads on semiconductor chips requires accurate measurement of the seating plane of the part being inspected. However, since lead lengths are unknown prior to inspection, prior art methods have avoided placing a part on its leads because such placement may crush or deform the leads. Instead, a part for inspection is held with its leads suspended. As a result, the actual seating plane of the part, as determined by the length of its leads seated on a planar surface, is not measured directly during the inspection process.

Instead of placing the part under inspection onto its actual seating plane with its leads contacting a flat surface the prior art indirectly calculates the seating plane for the part. The calculation is made with the part's leads suspended in air. Measurements for the calculated seating plane are made by sighting along a line determined by, for example, the three longest leads on the part being inspected. In order for such an approach to be valid an assumption is made that the three longest leads encompass the center of gravity of the part being inspected. However, in many cases the three longest leads may not encompass the center of gravity of the part being inspected. Such a part rocks on its leads. The inspection technique of the prior art may result in a rocking part erroneously passing inspection. A rocking part is a part which will not seat correctly but instead exhibits a rocking motion when placed on a flat surface.

Further, prior art measurement systems are subject to measurement variability leading to relatively large errors for some lead measurements when making a measurement of coplanarity. The measurement of coplanarity is defined as the distance from the seating plane, whether calculated or actual, to the bottom of the lead tip. FIG. 1 shows one example of the potential errors introduced by prior art systems in measuring the seating plane of the semiconductor chip 10. In FIG. 1, the actual seating plane is denoted by line 18 which is a line through the center points of the lead tips of leads 12A and 12B. However, in calculating or measuring the coplanarity of the leads using prior art techniques, calculated seating planes are subject to uncertainties due to error factors inherent in the prior art measuring instruments. Further, because of such inherent error factors, results are not repeatable using prior art techniques.

Therefore, in one measurement, the prior art may measure leg 12A with error E1 resulting in an inaccurately long measurement of the lead which results in placement of the seating plane through points S1 and S2. This, in turn, results in the seating plane denoted by broken line 14 which places lead 12C directly on the calculated seating plane 14. Lead 12C is elevated significantly higher than the actual seating plane 18. Calculated seating plane 14 also results in an exaggeratedly large error for lead 12D which appears to be raised high above the calculated seating plane 14 when in fact, at the point of measuring, lead 12D is actually significantly closer to actual seating plane 18.

Measurement errors of as small as 0.001 inch along a length of 1 inch of the semiconductor chip are extremely significant in the art. An error factor of 0.0002 inches in measuring a given lead can easily lead to significant errors in the calculation of the seating plane. Such error factors are inherent in prior art apparatus.

Similarly, a second measurement taken along the broken line 16 introduces error E2 which finds coplanarity through points S3 and S2. As in the foregoing example, it similarly places legs 12C and 12D incorrectly with respect to the actual seating plane 18. Such measurement errors can easily lead to the acceptance of parts which are subject to rocking motion when placed on, for example, a substrate or printed circuit board.

It is therefore the motivation of the present invention to avoid the errors inherent in the prior art and to provide a method of locating the seating plane exactly and directly through the use of mounting the part by its leads onto a known reference plane.

It is a further motivation of the present invention to determine the thickness of a part where the part thickness is defined as the distance from the seating plane determined by its leads in the seated position to the top of the part.

SUMMARY OF THE INVENTION

The present invention provides a method for part placement of a semiconductor chip for inspection. The semiconductor chip has a plurality of leads defining a seating plane and a body having a top. The method includes the steps of placing the body on a platform in an up position where the plurality of leads are suspended and probing the top of the body. After probing the top of the body the next step is measuring the first height of the top of the body with reference to a predetermined coordinate system. Once the first height of the top is measured, the next step includes moving the part until the part is seated on the plurality of leads on a reference plane. The reference plane is located at a predetermined height or distance on a selected axis of the predetermined coordinate system. This step is followed by probing the top of the body for a second time, and measuring the second height of the top of the body in the second position with reference to the predetermined coordinate system.

In one aspect of the invention, a thickness of the part is determined by subtracting the second height from the first height. The part thickness is also known by taking the difference in height between the second height and the predetermined height of the reference plane.

In another aspect of the invention the method further includes the steps of seating the part on an inspection surface by transporting the part to a predetermined distance above an inspection platform, where the predetermined distance is larger than the thickness of the part so as to allow clearance between the seating plane of the part and the inspection platform, and releasing the part on the inspection platform.

Other features, advantages and objects of the invention will be apparent through the description of the preferred embodiment, claims and drawings herein wherein like elements have like reference characters.

DESCRIPTION OF THE PREFERRED EMBODIMENT

Figure 1:
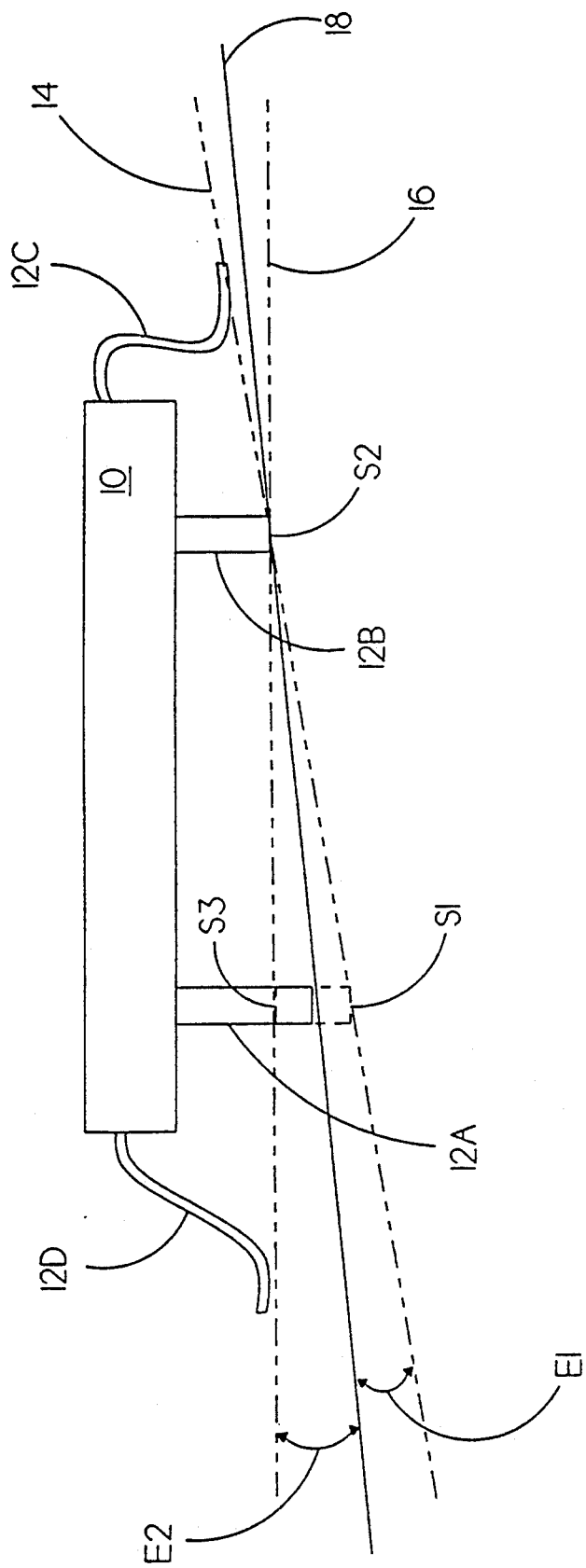
FIG. 1 shows schematically an example of seating plane measurements using prior art techniques.
Figure 2:
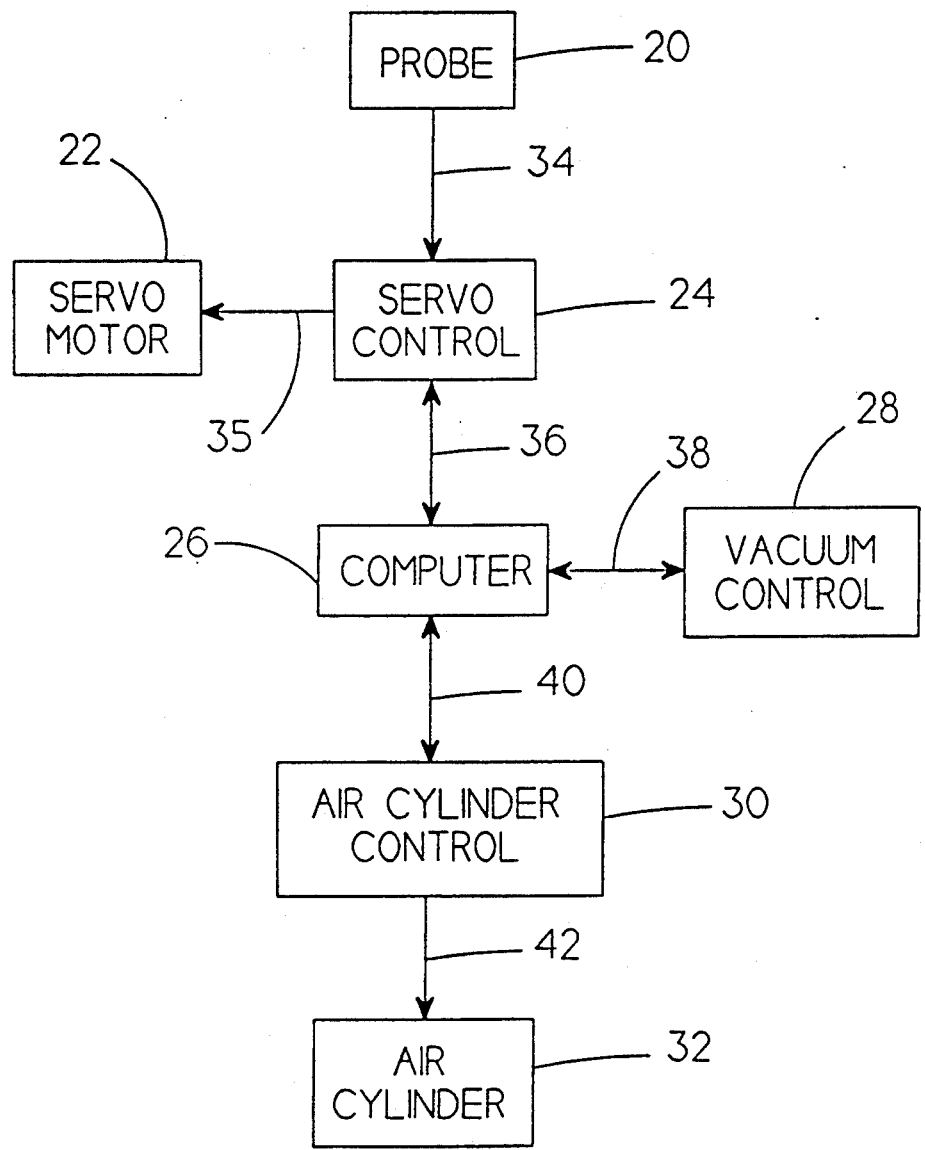
FIG. 2 shows a block diagram of one embodiment of apparatus employed in the present invention.

Referring now to FIG. 2, a probe 20, servo motor 22, servo control 24, computer 26, vacuum control 28, air cylinder control 30 and air cylinder 32 are shown. As will be explained further in detail with reference to the other figures, the probe 20 is moved by the servo motor 22 under control of the servo control 24. A sensing line 34 is received by the servo control 24. The servo control is itself under control of computer 26 through control lines 36. The computer 26 also controls vacuum control 28 by means of control lines 38. The computer 26 further controls air cylinder control 30 by means of control lines 40 and the air cylinder control 30, in turn, controls the air cylinder 32 through control lines 42. The servo control 24, servo motor 22, vacuum control 28, air cylinder control 30 and air cylinder 32 are well known devices controlled according to methods well known in the art. The computer 26 may comprise, for example, a commercially available personal computer.

Figure 3:
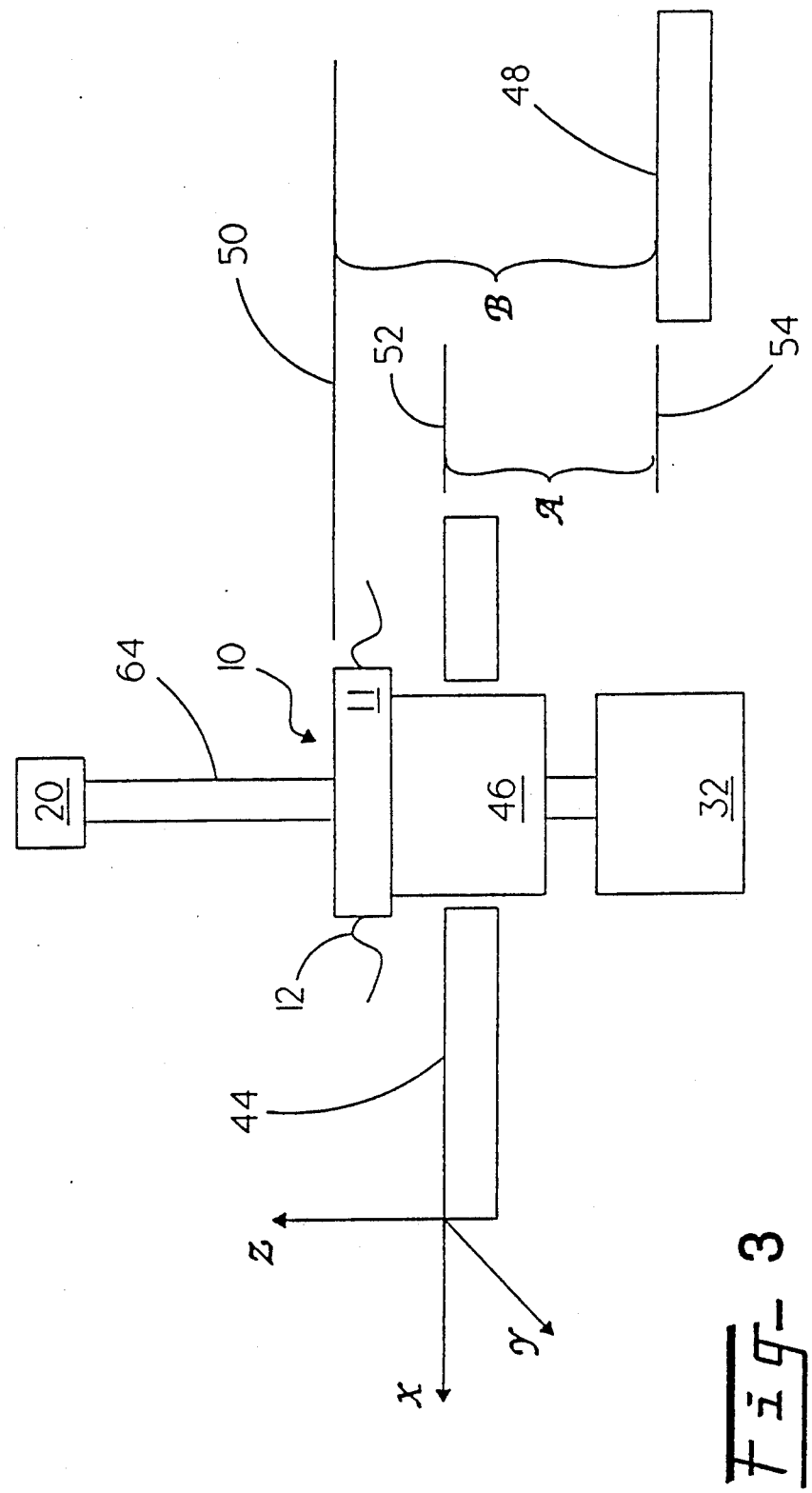
FIG. 3 schematically shows one example of the method and apparatus of the invention in a first configuration called the "up position".

Now referring to FIG. 3, a schematic diagram of one embodiment of the invention in a first position called the "up position" is shown. The apparatus is constructed with respect to a three dimensional orthogonal coordinate system having axes X, Y and Z.

A reference platform 44 is located at known X, Y and Z coordinates. The top of the reference platform 44 is located within a first plane which is parallel to the plane defined by the X and Y axes. The plane is called the reference plane and is generally indicated in FIG. 3 by line 52. Similarly the part 10 includes a flat top surface on its body 11 located within a second plane denoted generally by line 50 which is parallel to the reference plane. The distance from the top of the part to the seating plane of the part defines the thickness of the part 10. An inspection platform 48 is also located within a third plane parallel to the reference plane which is denoted generally by line 54. The reference plane 52 has a known location along the Z axis. Similarly the inspection plane 54 is located in a predetermined known location along the Z axis. The distance along the Z axis between the reference plane 52 and the inspection plane 54 is therefore known and may be defined as distance A. However, the distance from the plane defining the top of the part 10 from the inspection plane is unknown and is called distance B. The determination and use of distance B is explained hereinbelow with reference to the operation of the invention.

Figure 4:
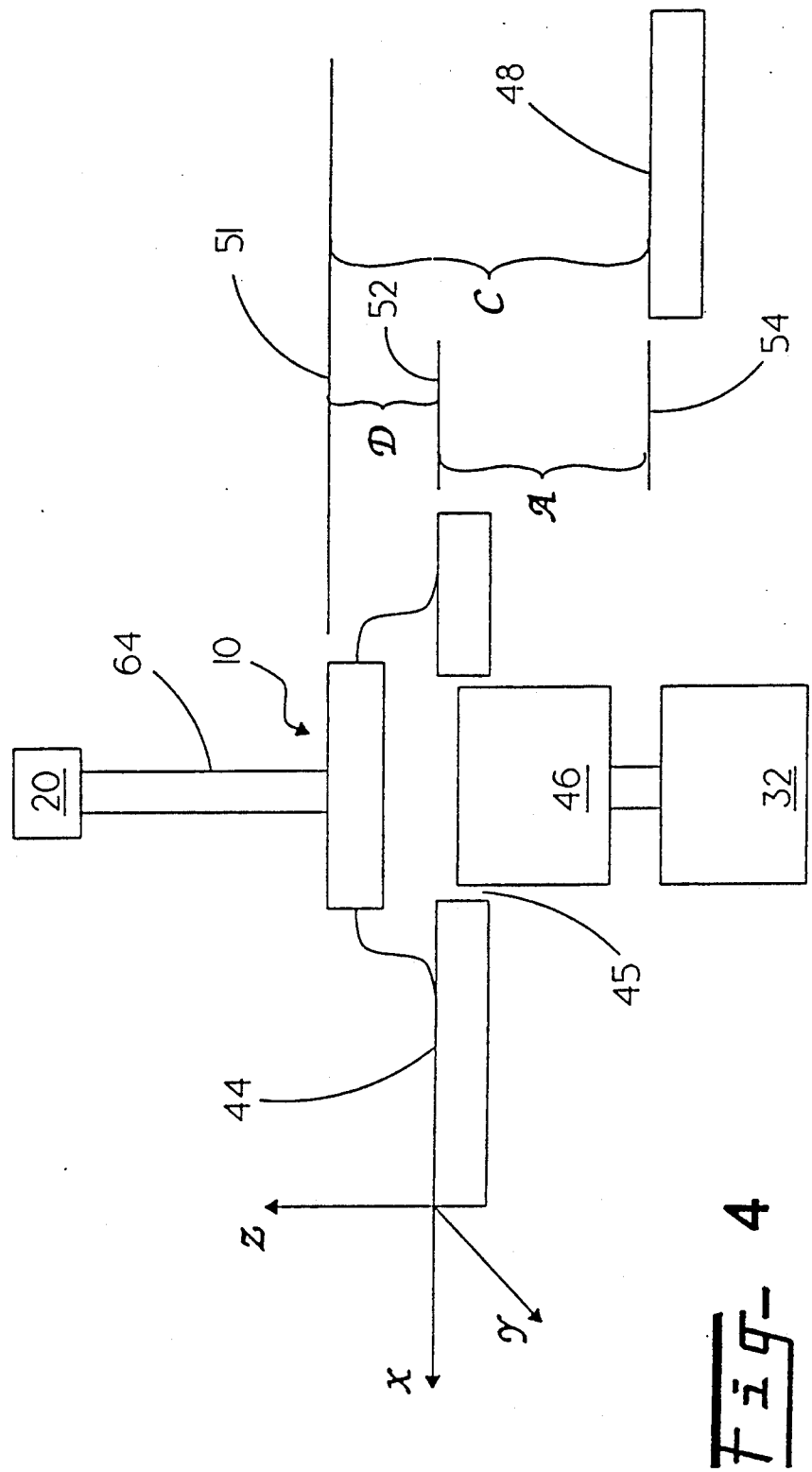
FIG. 4 shows one example of the apparatus of the invention in a second position called the "down position".

Now referring to FIG. 4, a configuration of one embodiment of the invention is shown with the pedestal 46 in the down position. In this position the pedestal 46 is withdrawn from underneath the part 10 so that the part straddles a pedestal opening 45 in the reference platform 44. This locates the top of the part 10 into a fourth horizontal plane indicated as line 51. As before, the distance between the reference plane 52 and the inspection plane 54 is known and is defined as distance A. However, the distance between the top of the part in plane 51 and the inspection plane 54 is also unknown and is defined as distance C. The determination of distance C is explained hereinbelow with respect to the discussion of the operation of the invention. Distance D determines the thickness of the part from its leads on the part's actual seating plane to the top of the part and is determined by the same measurement which yields distance C.

The probe 20 includes a probe element 64, which may be a wire, and is used to sense the position of the part 10. The probe 20 is also used with a vacuum to function as a part handler, as will be explained further hereinbelow.

Figure 5:
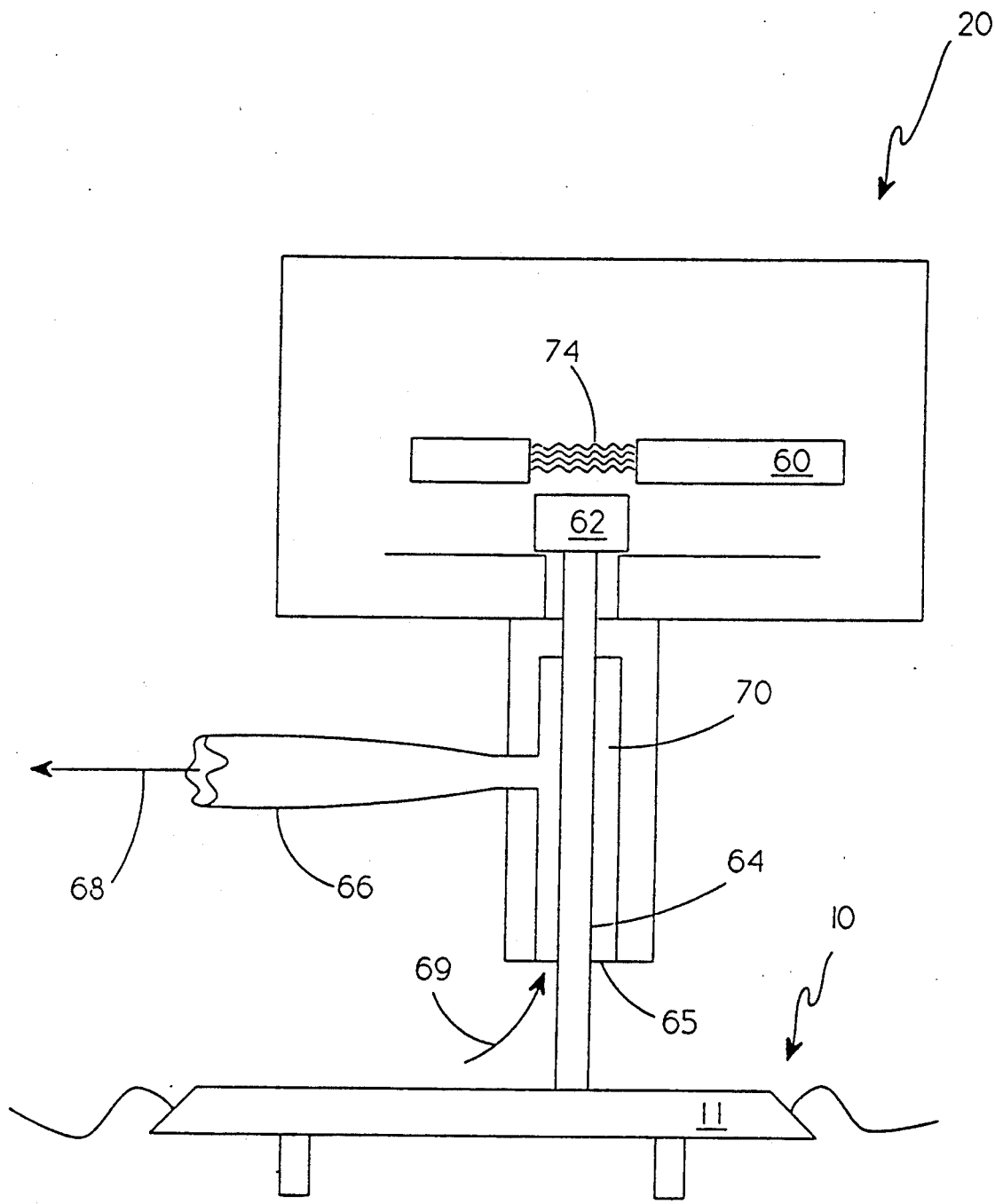
FIG. 5 shows a more detailed schematic diagram of the optical probe employed in one embodiment of the invention.

Now referring to FIG. 5, a more detailed view of the probe 20 is shown partially in cross section. The probe 20 includes an optical switch 60, a switch actuator 62, a vacuum chamber 70, and the probe element 64. The probe element 64 in one embodiment of the invention comprises a piece of piano wire. Other similar lightweight elements or wires exhibiting sufficient rigidity may be employed. Of course the same function may be achieved through the use of other similar devices such as optical, mechanical, magnetic or microswitches or other similar devices. The probe wire 64 pushes the actuator 62 upwards when the probe wire encounters a small resistance, such as when the probe is lowered and it strikes the top of the part. The actuator may be any material suitable for blocking light rays 74. When the actuator is pushed into the path of the light rays 74 the switch transmits a switching signal to the servo control on line 34.

When picking up and transporting a part, the vacuum chamber 70 is evacuated by a (not shown) well known vacuum device under control of the vacuum control 28 through computer 26 in a well known manner. The vacuum is controlled to pull a vacuum in the direction of arrow 68 resulting in an upward pull on part 10 indicated by arrow 69.

The probe 20 is thus used to pick up semiconductor chips 10 by gently lowering the probe nozzle 65 onto the part to within, for example, 0.001 inches. In one example of the invention the optical switch is located to be actuated by the probe element 64 at this distance. Thus the probe can easily sense its location with respect to the top of the part. When the desired distance from the part is reached, the vacuum is turned on by operation of the vacuum control as operated by the computer 26 through vacuum control line 38. The part is held fast by the vacuum for transport. The probe itself is moved by the servo motor 22 under control of the servo control 24 in a well known manner.

OPERATION OF THE INVENTION

Having explained the elements of the invention, the following description explains the operation of the invention in determining the seating plane of a part relative to the top of the part 10. This is done in such a way as to avoid applying damaging external forces on the leads of the part 10 while handling the part using a vacuum to place the part on the inspection plane by actual seating of the part's leads on the inspection platform.

Figure 6:
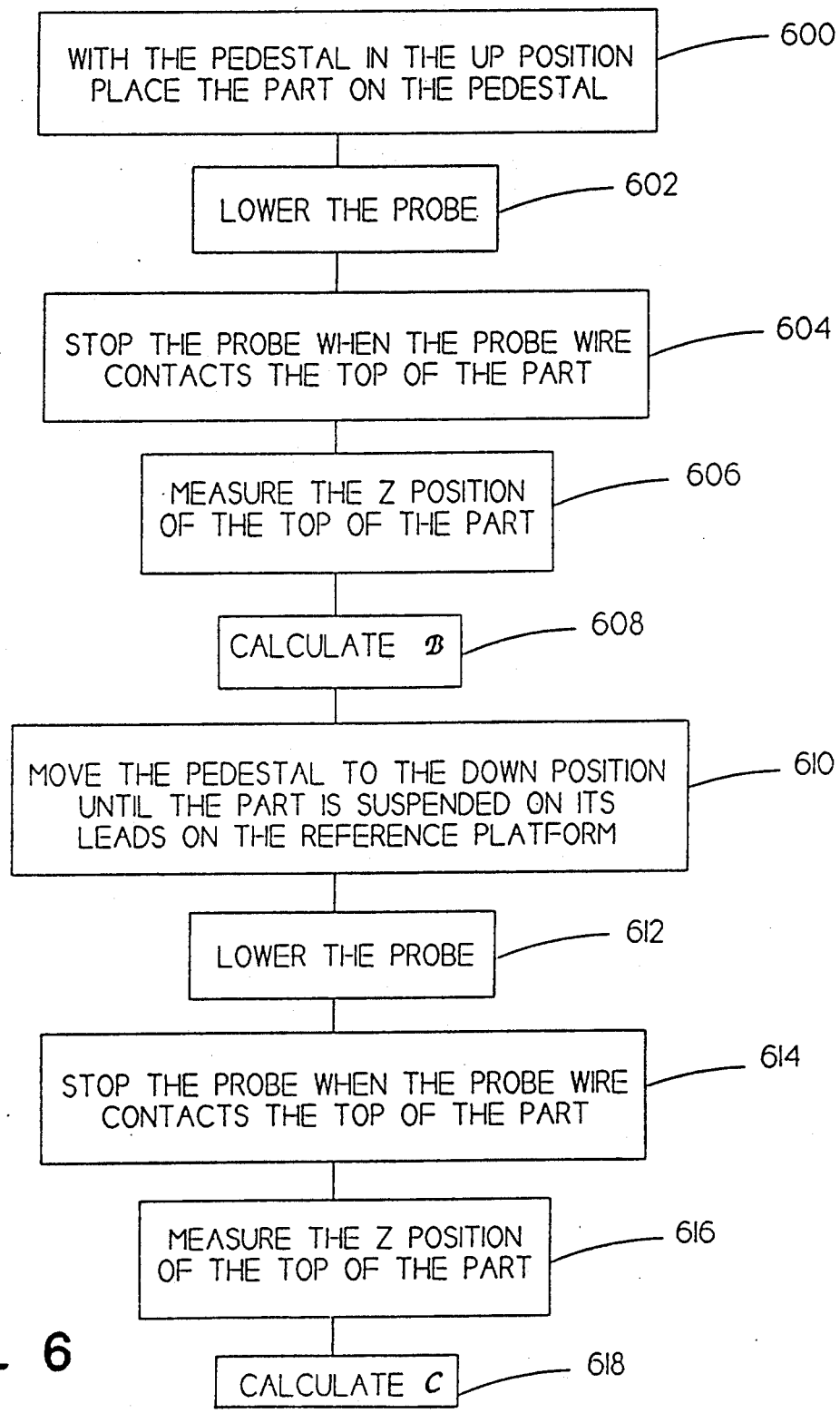
FIG. 6 shows a flow diagram of one example of the method of the invention for determining the height of a part above the seating plane of the part.

Referring now to FIG. 6, one example of the method of the invention for determining the seating plane of a part is shown. At step 600 with the pedestal in the up position, the part is placed onto the pedestal. In one embodiment of the invention the part is placed on the pedestal by the vacuum probe 20. In another embodiment of the invention the part may be placed on the pedestal by other means such as an automatic feeding apparatus or even manually.

If the vacuum probe 20 is used the vacuum is removed when the body of the part is within a very small distance from the top of the pedestal. This position is estimated to be the order of 1 mil or less from the top of the pedestal. The vacuum is turned off to release the part. The probe is then positioned to be lowered down 602 to the top of the part 10 until the probe element 64 contacts the top of the part 10. At step 604, the probe is stopped when the probe element 64 contacts the top of the part. Upon contacting the top of the part 10 the probe element 64 is pushed upwards a predetermined amount thereby driving the switch actuator 62 up into the optical switch blocking light rays 74 shown in FIG. 5 and actuating the switch. The switch then sends a signal via control lines 34 to the servo control which passes an appropriate control signal on line 35 to the servo motor 22 to stop the servo motor. The servo control also passes a signal on line 36 to the computer 26 indicating the position of the probe 20 which is known with respect to the distance travelled under operation of the servo motor. To measure the probe location the servo motor may include, for example, a well known encoding device. Since the probe element 64 is of a known length and the distance that the actuator 62 must travel is also known, the location along the Z axis of the top of the part 10 is straightforwardly determined by the computer 26. That is, since the position of the probe 20 is known it is merely a matter of, for example, subtracting the length of the probe from a predetermined reference point on the probe in order to calculate the Z position of the top of the part. This is called $Z_{probe1}$. Knowing $Z_{probe1}$ at step 606, distance B from the top of the part to the inspection plane can be calculated at process step 608 as the distance between $Z_{probe1}$ and the known location of the inspection plane.

Next, at process step 610, the pedestal is moved down in position until the part is suspended on its leads on the reference platform 44 as shown in FIG. 4. The part is now located below the previous position of the probe 20 and the probe is again lowered, at the 612, until the optical switch 60 is activated for a second time in the same manner as described hereinabove at process step 614. Once the optical switch is activated the process proceeds to step 616 where the Z position of the top of the part is again measured in a similar manner as that described hereinabove with reference to step 606. Once the second Z position called $Z_{probe2}$ is known, the distances C and D can be calculated at 618 in a similar manner as the calculation was done for distance B in step 608. At this point the thickness of the part from the top of the part to the seating plane can be calculated as the difference between distance B and distance C or equivalently as distance D which is the difference between the $Z_{probe2}$ and the height of the reference plane.

Figure 7:
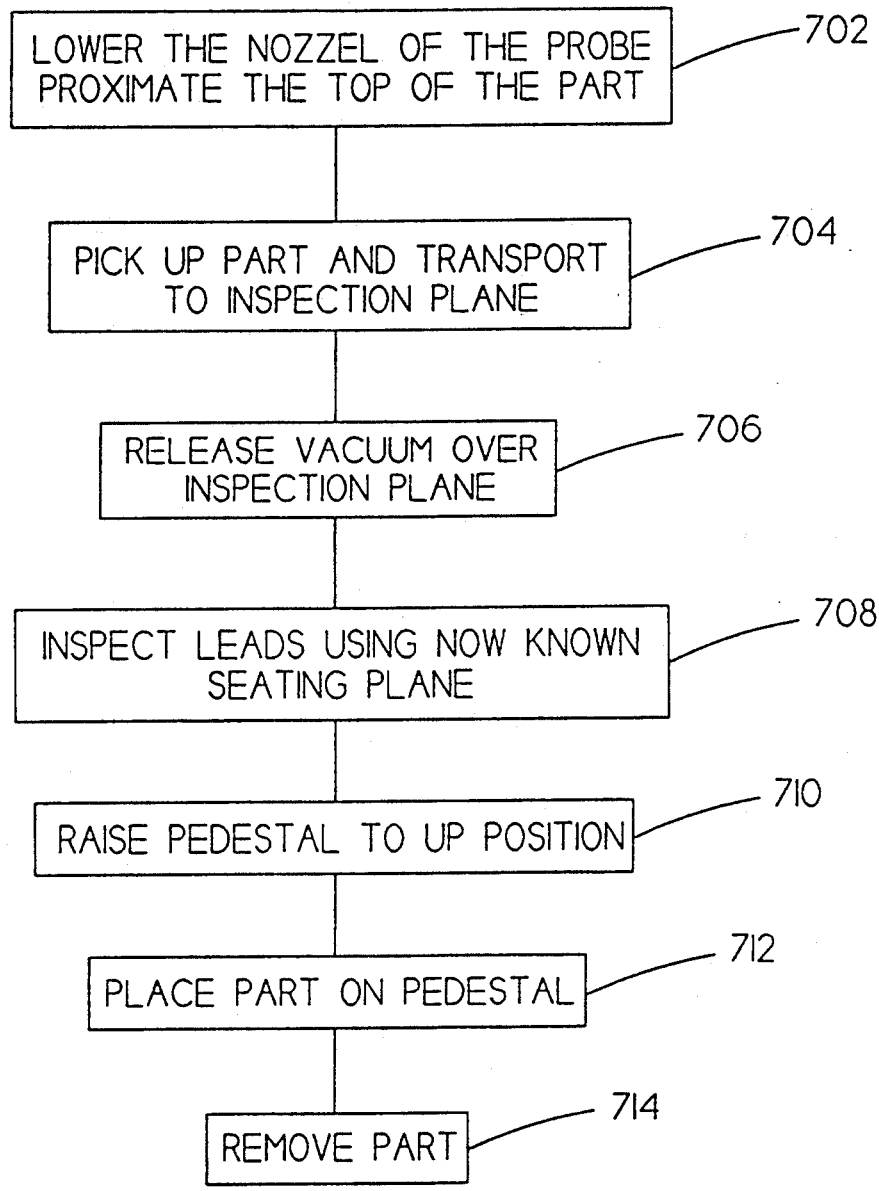
FIG. 7 shows a flow diagram of one example of the method of the invention for placing a part on an inspection plane.

It is one aspect of the invention to move the part from the pedestal area to the inspection area without displacing or damaging the leads. Since distance C is now known this can be done as shown with reference now to FIG. 7. FIG. 7 shows one method of the invention for placing a part on an inspection platform. At process step 702 the nozzle 65 of probe 20 is located proximate the top of the part 10. Since distance C is now known as well as distance A, positioning the probe may be accomplished with precision. In one embodiment of the invention the nozzle is positioned to within about 1 mil of the top of the part and the vacuum is then turned on. The part is picked up, at step 704, by the force of the vacuum and then transported by using the servo motor to move the probe to the inspection plane. Since the distances A and C are known the part can be precisely lowered to within 1 mil or less of the inspection platform without risk of damaging the leads. At step 706, the vacuum is once again turned off and the part is released onto the inspection plane. Releasing the part in this way limits downward force to the part's leads to approximately equal the mass of the part under the force of gravity.

The part, therefore, comes to rest under force of gravity and the leads are displaced naturally under the part's own mass as in actual use. Placing the part on its leads uses the leads directly as a reference plane or seating plane. This step is an improvement over the prior art since it eliminates the step of calculating the seating plane. At process step 708 the leads may be inspected and the coplanarity measurement of each lead can be made directly from the actual seating plane.

Once the inspection of the part is completed the part may be removed by reversing the above-described process. In one aspect of the invention the pedestal is raised to the up position at step 710 prior to removing the part from the inspection platform. Since distance B is known, the part may be transported precisely back to the pedestal and released thereon at step 712 with its leads suspended as in FIG. 3. The part may then be removed at step 714 by automatic or manual handling. In an alternative embodiment of the invention, the part may be picked up by the vacuum probe and transported to another output location such as a component tray.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A method for measuring the position of a part having a plurality of leads defining a seating plane and a body having a top, the method comprising the steps of:
    (a) placing the body on a platform in an up position wherein the plurality of leads are suspended;
    (b) probing the top of the body;
    (c) measuring a first height of the top of the body;
    (d) moving the platform to a down position until the part is seated on the plurality of leads on a reference plane;
    (e) probing the top of the body for a second time; and
    (f) measuring a second height of the top of the body in the down position.

2. The method of claim 1 wherein a thickness of the part is determined by the difference between the second height and the first height.

3. The method of claim 2 further comprising the steps of seating the part on an inspection surface by transporting the part to a predetermined distance above an inspection platform, wherein the predetermined distance is larger than the thickness of the part so as to allow clearance between the seating plane of the part and the inspection platform, and releasing the part on the inspection platform.

4. The method of claim 3 further comprising the step of inspecting the plurality of leads after the part is seated on the inspection platform.

5. The method of claim 4 further including the steps of removing the part from the inspection platform after the step of inspecting and transporting the part back onto the platform in the up position with the plurality of leads suspended.

6. The method of claim 1 wherein the thickness of the part from the top to its seating plane is determined by calculating the difference between the second height and a predetermined height of the reference plane.

7. An apparatus for inspecting a part comprising:
 (a) means for holding a part in a first position;
 (b) means for moving the part to a second position having a reference plane located below the first position;
 (c) means for probing the part located proximately above the part holding means for determining a first and second part position when the part is in the first and second positions, respectively; and
 (d) means for determining the thickness of the part by calculating the distance traveled by the part from the first position to the second position wherein the thickness of the part is determined as a difference between the first and second part positions.

8. The apparatus of claim 7 wherein the part has a plurality of leads, the apparatus further comprising means for transporting and releasing the part from the reference plane to an inspection plane so as to release the part at a predetermined location above the inspection plane where none of the leads contact the inspection plane prior to release of the part and damage to the leads is avoided.

9. The apparatus of claim 7 wherein the part probing means further comprises:
 (a) an optical switch including a beam path;
 (b) means for blocking the beam path wherein the blocking means is held below the beam path; and
 (c) a wire probe attached at a top end to the blocking means wherein the blocking means is raised in response to the wire probe.

10. The apparatus of claim 9 wherein the probing means further includes a vacuum chamber for picking up parts.

11. The apparatus of claim 10 wherein the probing means is attached to a servo motor means, the servo motor means is connected by control lines to a servo motor control means and the part probing means includes a sense line which is connected at a sense line input to the servo motor control means.

12. The apparatus of claim 11 wherein the servo motor control means includes a computer interface and the servo motor control means computer interface is connected to a computer so as to enable the computer to operate the servo motor control means.

13. The apparatus of claim 12 wherein the computer includes a vacuum control command and wherein the probing means vacuum chamber is coupled to a vacuum means, the vacuum means is connected to be controlled by a vacuum control means which includes a computer vacuum control input connected to the vacuum control command.

14. The apparatus of claim 13 wherein the computer further includes an air cylinder control command and the means for moving the part to the second position comprises:
 (a) an air cylinder including an air cylinder control line; and
 (b) an air cylinder control means having an air cylinder control output connected to the air cylinder control line and an air cylinder control input connected to the air cylinder control command so as to enable the air cylinder to move to an up position and a down position in response to commands from the computer.

15. A part inspection apparatus comprising:
 (a) a probe assembly including a vacuum chamber and a probe element;
 (b) a servo motor attached to the probe assembly wherein the servo motor includes a servo motor control input;
 (c) a servo control having a servo control output connected to the servo motor control input and wherein the servo control includes a servo command input;
 (d) a vacuum apparatus including a vacuum control input;
 (e) a vacuum control including a vacuum control output connected to the vacuum control input and having a vacuum command input;
 (f) positioning means for moving a part from an up position to a down position wherein the positioning means includes a position command input;
 (g) a reference platform located at a predetermined location proximate the positioning means for holding the part when the positioning means moves to the down position;
 (h) an inspection platform located on a predetermined inspection plane at a known distance from the reference platform; and
 (i) control means including a vacuum control command connected to the vacuum command input, a servo control command connected to the servo command input and a positioning command connected to the position command input.

16. The apparatus of claim 15 wherein the positioning means comprises an air cylinder and air cylinder control apparatus.

* * * * *

UNITED STATES PATENT AND TRADEMARK OFFICE
CERTIFICATE OF CORRECTION

PATENT NO. : 5,307,149
DATED : 4/26/94
INVENTOR(S) : Steven G. Palm, et al.

It is certified that error appears in the above-identified patent and that said Letters Patent is hereby corrected as shown below:

Col. 5, line 51, the second occurrence of the word "the" should be deleted and replaced with --step--.

Signed and Sealed this

Thirtieth Day of August, 1994

*Attest:*

BRUCE LEHMAN

*Attesting Officer*    Commissioner of Patents and Trademarks